(12) United States Patent
Lee et al.

(10) Patent No.: US 6,995,447 B2
(45) Date of Patent: Feb. 7, 2006

(54) SILICON ON INSULATOR DEVICE HAVING TRENCH ISOLATION LAYER AND METHOD FOR MANUFACTURING THE SAME

(75) Inventors: Tae-jung Lee, Suwon (KR); Byung-sun Kim, Suwon (KR); Myoung-hwan Oh, Anyang (KR); Seung-han Yoo, Yongin (KR); Myung-sun Shin, Seoul (KR); Sang-wook Park, Seoul (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/810,285

(22) Filed: Mar. 26, 2004

(65) Prior Publication Data

US 2004/0178450 A1 Sep. 16, 2004

Related U.S. Application Data

(62) Division of application No. 10/114,215, filed on Apr. 2, 2002, now Pat. No. 6,737,706.

(30) Foreign Application Priority Data

Jul. 28, 2001 (KR) ................................ 2001-45693

(51) Int. Cl.
*H10L 29/00* (2006.01)
*H10L 27/01* (2006.01)
*H10L 29/76* (2006.01)
*H10L 29/40* (2006.01)

(52) U.S. Cl. ...................... 257/507; 257/751; 257/774; 257/374; 257/347

(58) Field of Classification Search ................ 257/347, 257/507, 751, 775, 774, 374
See application file for complete search history.

(56) References Cited

U.S. PATENT DOCUMENTS

| | | | |
|---|---|---|---|
| 4,222,792 A | 9/1980 | Lever et al. | 438/435 |
| 6,227,707 B1 | 5/2001 | Anderson | 438/430 |
| 6,331,469 B1 | 12/2001 | Park et al. | 438/296 |
| 6,383,920 B1 * | 5/2002 | Wang et al. | 438/639 |
| 6,479,368 B1 | 11/2002 | Mandelman et al. | 438/435 |
| 2002/0072227 A1 | 6/2002 | Russell et al. | 438/653 |
| 2002/0142585 A1 | 10/2002 | Mandal | 438/633 |
| 2003/0134499 A1 | 7/2003 | Chen et al. | 438/618 |

* cited by examiner

*Primary Examiner*—Chuong Anh Luu
(74) *Attorney, Agent, or Firm*—Mills and Onello, LLP

(57) ABSTRACT

A silicon-on-insulator (SOI) device and a method for manufacturing the same includes a substrate, which includes a base layer, a buried oxide layer, and a semiconductor layer, and an isolation layer which is formed in a trench that defines an active region on the semiconductor layer. The trench comprises a first region having a depth smaller than the thickness of the semiconductor layer and a second region having a depth as much as the thickness of the semiconductor layer. The isolation layer includes an oxide layer and a nitride liner that are sequentially formed along the surface of the trench and a dielectric layer that fills the trench.

8 Claims, 15 Drawing Sheets

SILICON ON INSULATOR DEVICE HAVING TRENCH ISOLATION LAYER AND METHOD FOR MANUFACTURING THE SAME

RELATED APPLICATION

This application is a divisional of U.S. application Ser. No. 10/114,215, filed on Apr. 2, 2002, now U.S. Pat. No. 6,737,706 which relies for priority upon Korean Patent Application No. 01-45693, filed on Jul. 28, 2001, the contents of which are herein incorporated by reference in their entirety.

BACKGROUND OF THE INVENTION

1. Field of the Invention

The present invention relates to a semiconductor device and a method for manufacturing the same, and more particularly, to a semiconductor device using a silicon-on-insulator (SOI) substrate (hereinafter, referred to as a "SOI device") and method for manufacturing the same.

2. Description of the Related Art

A SOI substrate, unlike a bulk silicon substrate, has a stacked structure including a base layer, providing a supporting means, a buried oxide layer, and a semiconductor layer, on which devices are formed. SOI devices integrated on such a SOI substrate can be completely isolated from one another by the buried oxide layer. In addition, since the SOI devices can reduce junction capacitance, they provide for reduced power consumption and increased operational speed. As the performance of semiconductor devices continues to improve, the range of applications for SOI devices continues to expand.

Conventional SOI devices will now be described with reference to FIGS. 1 and 2A through 2E. The same reference numerals in different drawings represent the same elements.

FIG. 1 is a cross-sectional view illustrating a conventional SOI device having a trench isolation layer and a method for manufacturing the same. Referring to FIG. 1, a substrate 30 comprised of a base layer 10, a buried oxide layer 15, and a semiconductor layer 20 is provided. A trench A is formed to define an active region on the semiconductor layer 20 and exposes the buried oxide layer 15. Next, a thermal oxide layer 32 and a nitride liner 36 are sequentially deposited along the surface of the trench A, and a dielectric layer 37 is formed to completely fill the trench A. Then, an isolation layer 41, which includes the thermal oxide layer 32, the nitride liner 36, and the dielectric layer 37, is completed. As shown in FIG. 1, since the bottom of the isolation layer 41 contacts the buried oxide layer 15, the isolation layer 41 is referred to as a deep isolation layer.

Next, a gate insulating layer 75 is deposited on the active region, and then a gate electrode 80 is formed. Next, a source/drain region 90 is formed at either side of the gate electrode 80. The source/drain region 90, like the isolation layer 41, is formed such that the bottom of the source/drain region 90 contacts the buried oxide layer 15. Accordingly, a transistor being formed in the active region can be completely isolated while being surrounded by the isolation layer 41 and the buried oxide layer 15, and thus junction capacitance can be decreased. Therefore, a SOI device including a deep isolation layer can operate at high speeds.

However, when forming the thermal oxide layer 32, oxygen atoms may infiltrate into an interfacial portion between the semiconductor layer 20 and the buried oxide layer 15, and thus an oxidation reaction may occur at the interface between the semiconductor layer 20 and the buried oxide layer 15. If so, the semiconductor layer 20 may be separated from the buried oxide layer 15 and then may be bent. If the semiconductor layer 20 is bent, a defect, such as dislocation, may occur, and thus leakage current may be caused to increase.

In the SOI device having a deep isolation layer shown in FIG. 1, unlike a device using a bulk silicon substrate, a body, i.e., the semiconductor layer 20, is electrically floated. Thus, when operating the SOI device, electric charge can accumulate under the channel region. The loaded electric charges cause a parasitic bipolar-induced breakdown or latch-up phenomenon and make the operational characteristics of the SOI device unstable. This problem is called a floating body effect.

In order to prevent the floating body effect, an SOI device has been proposed in which an isolation layer is shallowly formed such that the bottom of the isolation layer does not contact the buried oxide layer, a body contact is formed at the semiconductor layer under the isolation layer, and a predetermined voltage is applied to the body contact. The isolation layer may be called a shallow isolation layer, as compared to the deep isolation layer described above. The operational characteristics of the SOI device having the shallow isolation layer are stable; however, the SOI device having the shallow isolation layer has a problem in that junction capacitance increases because a junction portion is generated between the semiconductor layer and the source/drain region.

Recently, various studies have been conducted on a method for manufacturing an isolation layer having a dual trench structure, i.e., a trench having two different depths.

FIGS. 2A through 2E are cross-sectional views illustrating a conventional SOI device including an isolation layer having a dual trench structure and a method for manufacturing the same. Referring to FIG. 2A, a substrate 30, which includes a base layer 10, a buried oxide layer 15, and a semiconductor layer 20, is provided. A mask pattern 42, which is comprised of a pad oxide layer 35 and a nitride layer 40, is formed to expose a region on which an isolation layer for defining an active region on the semiconductor layer 20 will be formed. Next, the semiconductor layer 20 is etched using the mask pattern 42 as an etching mask, thereby forming a shallow trench B in the semiconductor layer 20. A thermal oxide layer 32 is deposited along the surface of the shallow trench B, and then a photoresist layer pattern 50 is formed on the resulting substrate 30 such that a predetermined portion of the thermal oxide layer 32 on the bottom surface of the shallow trench B is exposed.

Referring to FIG. 2B, the thermal oxide layer 32 and the semiconductor layer 20 are etched using the photoresist layer pattern 50 as an etching mask, thereby forming a deep trench C which exposes the buried oxide layer 15. At the time of etching the thermal oxide layer 32 and the semiconductor layer 20, the thermal oxide layer 32 formed at a sidewall of the shallow trench B is etched so that the sidewalls of the deep trench C are exposed. Then, a dual trench D comprised of the shallow trench B and the deep trench C and having different depths is completed. Next, the photoresist layer pattern 50 is removed by ashing.

Referring to FIG. 2C, a nitride liner 60 is formed on the resulting substrate 30 shown in FIG. 2B, and a dielectric layer 65 is formed to completely fill the dual trench D. Next, the resulting substrate 30 is planarized so that the top surface of the nitride layer 40 is exposed. In the case of planarizing the substrate 30 by chemical mechanical polishing (CMP), the top surface of the dielectric layer 65 may become lower than the top surface of the nitride layer 40 due to the difference in the polishing rates between the dielectric layer 65 and the nitride layer 40.

Referring to FIG. 2D, the nitride layer 40 is removed to expose the pad oxide layer 35. At the time of removing the nitride layer 40, the nitride liner 60 is partially removed along with the nitride layer 40 so that a groove G is formed between the pad oxide layer 35 and the dielectric layer 65.

Referring to FIG. 2E, the pad oxide layer 35 is removed so that the top surface of the semiconductor layer 20 is exposed. Then, an isolation layer 70, which includes the thermal oxide layer 32, the nitride liner 60, and the dielectric layer 65 in the dual trench D, is completed. Next, a transistor is formed in the active region by a well-known method, thereby completing a SOI device.

As shown in FIG. 2E, the bottom of the isolation layer 70 has a step difference. Since the deep trench C in the isolation layer 70 is formed to contact the buried oxide layer 15, junction capacitance can be reduced. In the isolation layer 70, the shallow trench B is formed not to contact the buried oxide layer 15, and thus the floating body effect can be prevented by forming a body contact at the semiconductor layer 20 and by applying a predetermined voltage to the body contact.

However, the groove G still exists between the semiconductor layer 20 and the dielectric layer 65, in other words, between the semiconductor layer 20 and the isolation layer 70. If a groove is formed along the edge of an isolation layer, as shown in FIG. 2E, a parasitic transistor may be formed, and thus a hump phenomenon, in that a SOI device seems to have two threshold voltages, may be caused in the current-voltage curve of the SOI device. Accordingly, it is impossible to limit the operational voltage of the SOI device. In addition, the gate insulating layer of the SOI device may deteriorate.

There is another problem with the conventional SOI device including an isolation layer having a dual trench structure. That is, as described with reference to FIG. 2C, the nitride liner 60 is formed to directly contact the sidewall of the semiconductor layer 20 exposed by the deep trench C. The nitride liner 60 and the semiconductor layer 20 have different physical properties including different thermal expansion coefficients. Thus, the nitride liner 60 that is formed to directly contact the semiconductor layer 20 inevitably applies mechanical stress on the semiconductor layer 20. Accordingly, various defects may occur at the semiconductor layer 20, and then the characteristics of the SOI device may deteriorate.

In order to prevent the nitride liner 60 from directly contacting the semiconductor layer 20, a material layer, which has physical properties somewhere between the nitride liner 60 and the semiconductor layer 20, for example, an oxide layer, may be further formed. However, even if an oxide layer is further formed, as described above with reference to FIG. 1, the semiconductor layer 20 may be separated from the buried oxide layer 15 and then may be bent because the deep trench C is formed to expose the buried oxide layer 15.

SUMMARY OF THE INVENTION

To solve the above-described problems, it is a first object of the present invention to provide a SOI device which has low junction capacitance and stable operational characteristics.

It is a second object of the present invention to provide a SOI device which prevents a gate insulating layer from deteriorating by preventing a groove from being formed at the surface of a semiconductor layer between the semiconductor layer and an isolation layer.

It is a third object of the present invention to provide a method for manufacturing a SOI device in which an isolation layer is formed to prevent the semiconductor layer from being bent.

Accordingly, to achieve the first and second objects, there is provided a semiconductor device including a substrate which includes a base layer, a buried oxide layer, and a semiconductor layer, and an isolation layer which is formed in a trench that defines an active region on the semiconductor layer. Here, the trench comprises a first region having a depth less than the thickness of the semiconductor layer and a second region having a depth as much as the thickness of the semiconductor layer, and the isolation layer includes an oxide layer and a nitride liner that are sequentially formed along the surface of the trench and a dielectric layer that fills the trench.

The oxide layer may be thicker in the first region than in the second region. For example, the oxide layer is thicker in the first region than in the second region by 1–50 nm.

To achieve the third object, there is provided a method for manufacturing a semiconductor device. A substrate, which includes a base layer, a buried oxide layer, and a semiconductor layer, is provided. A trench is formed to include a first region having a depth less than the thickness of the semiconductor layer and a second region having a depth as much as the thickness of the semiconductor layer. An isolation layer is formed by sequentially forming an oxide liner and a nitride liner along the surface of the trench and then forming a dielectric layer to fill the trench.

Here, the step of forming the trench may include forming a first trench in the semiconductor layer, forming an oxide layer along the surface of the first trench, and forming a second trench at a predetermined portion of the bottom of the first trench in which the oxide layer is formed to expose the buried oxide layer. The oxide layer is preferably formed by thermal oxidation.

The oxide liner is preferably formed by chemical vapor deposition (CVD). More preferably, the oxide liner is formed by low pressure (LP)-CVD. The oxide liner is preferably formed at a temperature of 650–750° C.

According to a preferred embodiment of the present invention, a substrate including a base layer, a buried oxide layer, and a semiconductor layer is provided. A pad oxide layer and a nitride layer are sequentially formed on the semiconductor layer. The pad oxide layer and the nitride layer are patterned to expose a region on which an isolation layer for defining the active region on the semiconductor layer will be formed. The semiconductor layer is etched using the patterned pad oxide layer and nitride layer as etching masks to form a first trench in the semiconductor layer. A thermal oxide layer is formed along the surface of the first trench by heat-treating the substrate on which the first trench is formed in a gas atmosphere containing oxygen. A photoresist layer pattern is formed on the substrate on which the thermal oxide layer is formed to expose a predetermined portion of the bottom of the first trench. The thermal oxide layer and the semiconductor layer are etched using the photoresist layer pattern as an etching mask to form a second trench exposing the buried oxide layer. The photoresist layer pattern is removed. An oxide liner is formed on the substrate on which the second trench is formed by CVD. A nitride liner is formed on the substrate on which the oxide liner is formed. A dielectric layer is formed on the substrate on which the nitride liner is formed to completely fill the first and second trenches. The substrate on which the dielectric layer is planarized to expose the top surface of the patterned nitride layer. The patterned pad oxide layer and nitride layer are removed. A gate electrode is formed by forming a gate insulating layer on the active region. A source/drain region is formed at either side of the gate electrode.

Here, the first trench is formed to a height of 200–1500 Å on the buried oxide layer, and the thermal oxide layer is formed to a thickness of 1–50 nm. The oxide liner is formed at a temperature of 650–750° C. The oxide liner is formed to a thickness of 3–30 nm. The nitride liner is formed to a thickness of 3–20 nm.

According to the present invention, it is possible to provide a SOI device having low junction capacitance and stable operational characteristics. It is further possible to prevent the gate insulating layer from deteriorating and to manufacture a SOI device having high reliability by preventing a groove from being generated between a semiconductor layer and an isolation layer. In addition, it is possible to manufacture a SOI device by forming the isolation layer while preventing bending of the semiconductor layer. Finally, it is possible to prevent any increase in leakage current due to the dislocation defect.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF PREFERRED EMBODIMENTS

Figure 1:
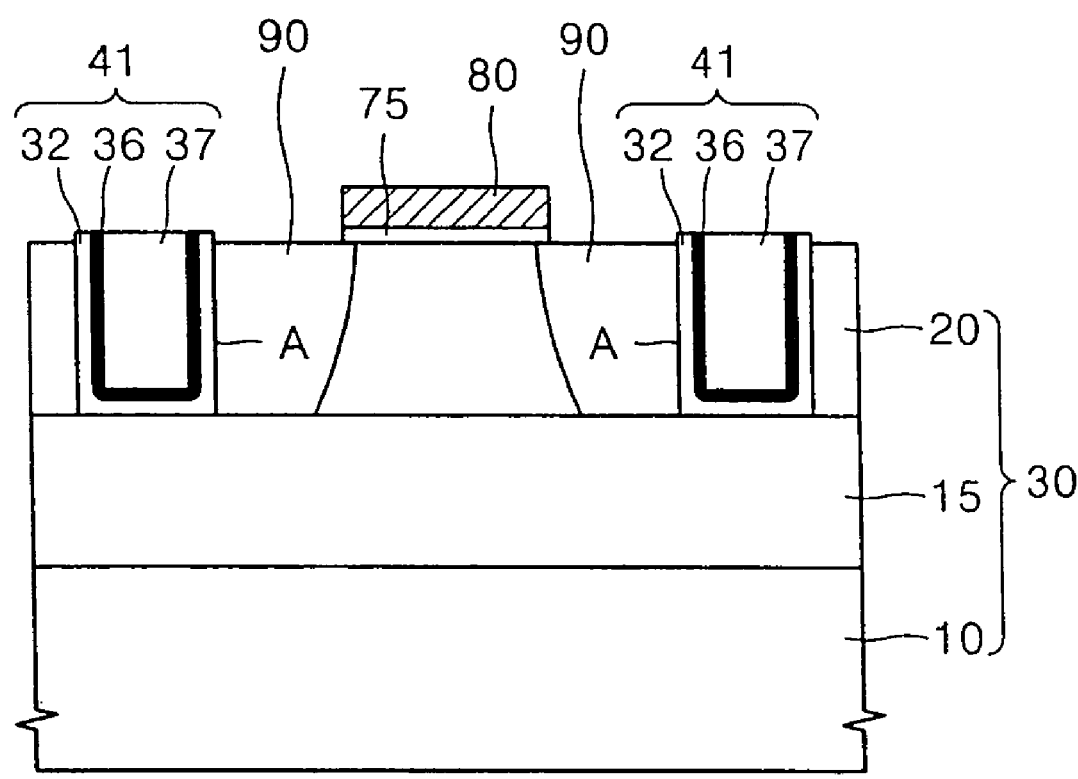
FIG. 1 is a cross-sectional view illustrating a conventional SOI device including a trench isolation layer and a method for manufacturing the same.
Figure 2A:
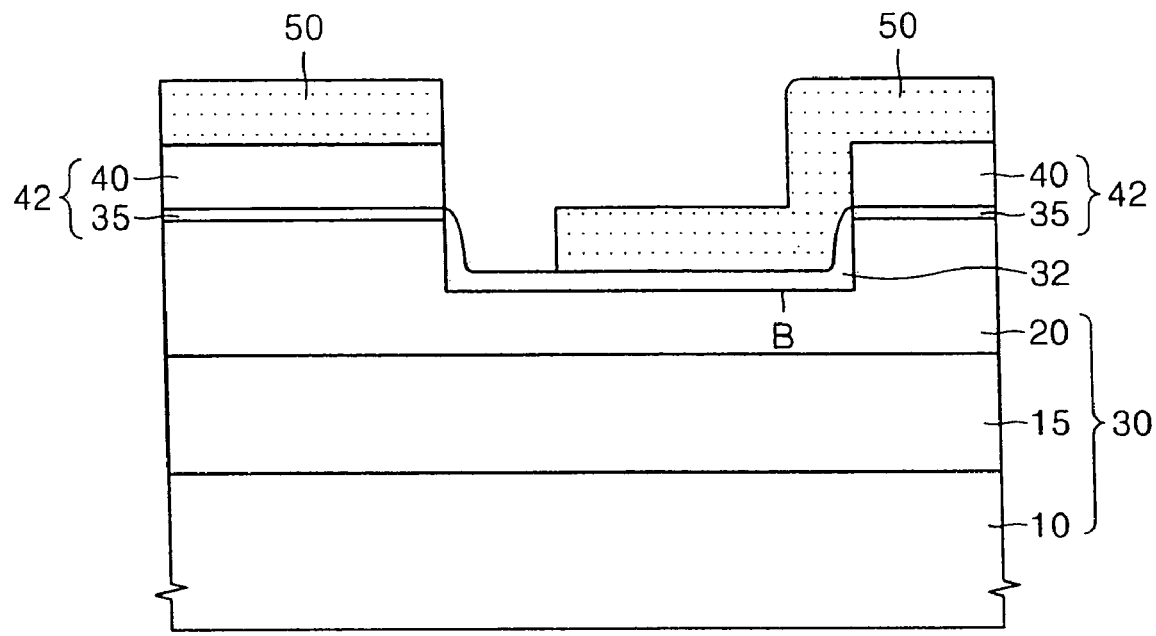
FIGS. 2A through 2E are cross-sectional views illustrating a conventional SOI device including an isolation layer having a dual trench structure and a method for manufacturing the same.
Figure 2B:
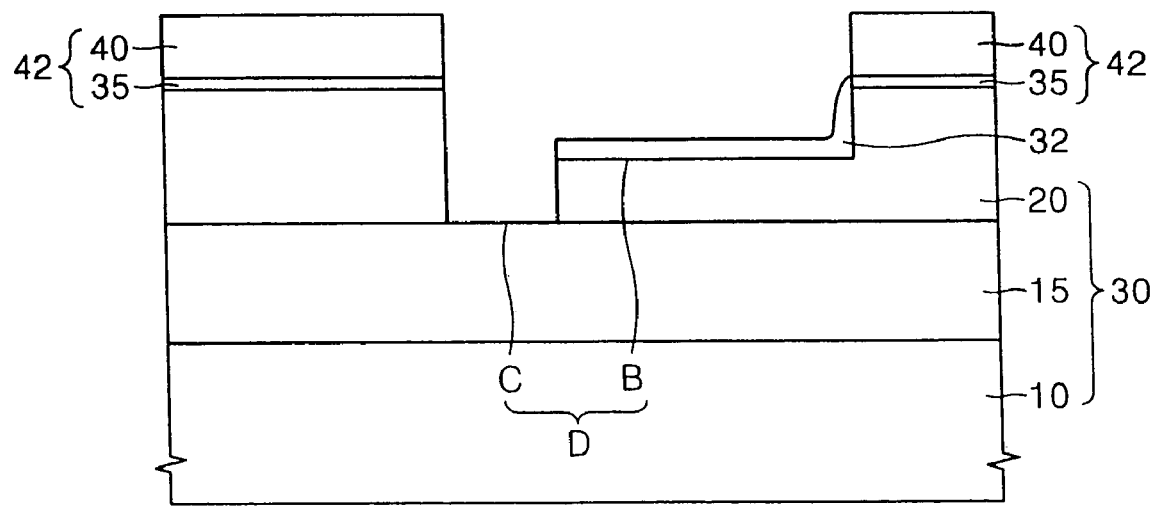
Figure 2C:
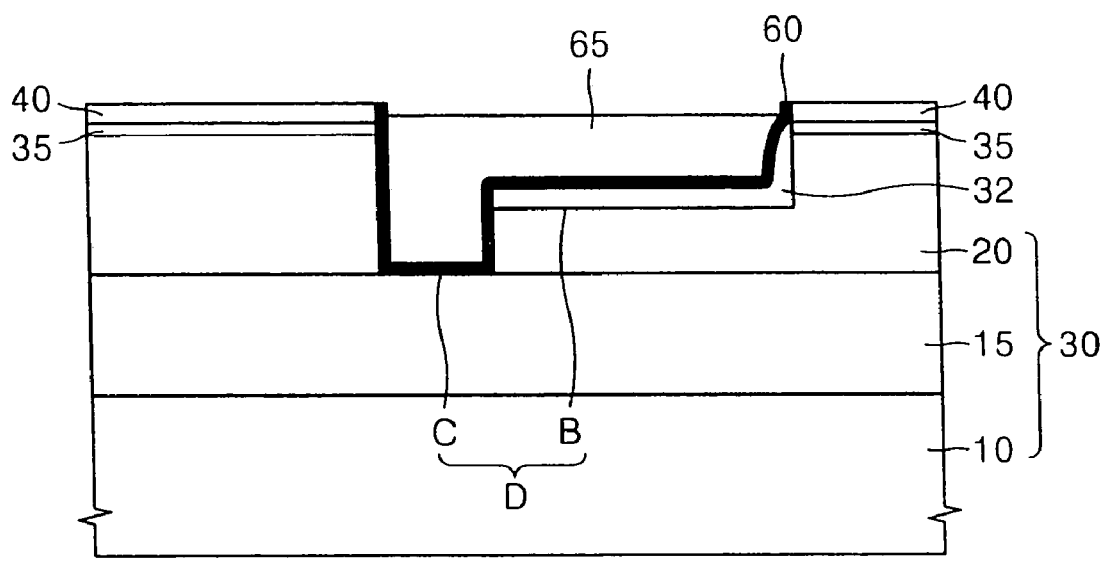
Figure 2D:
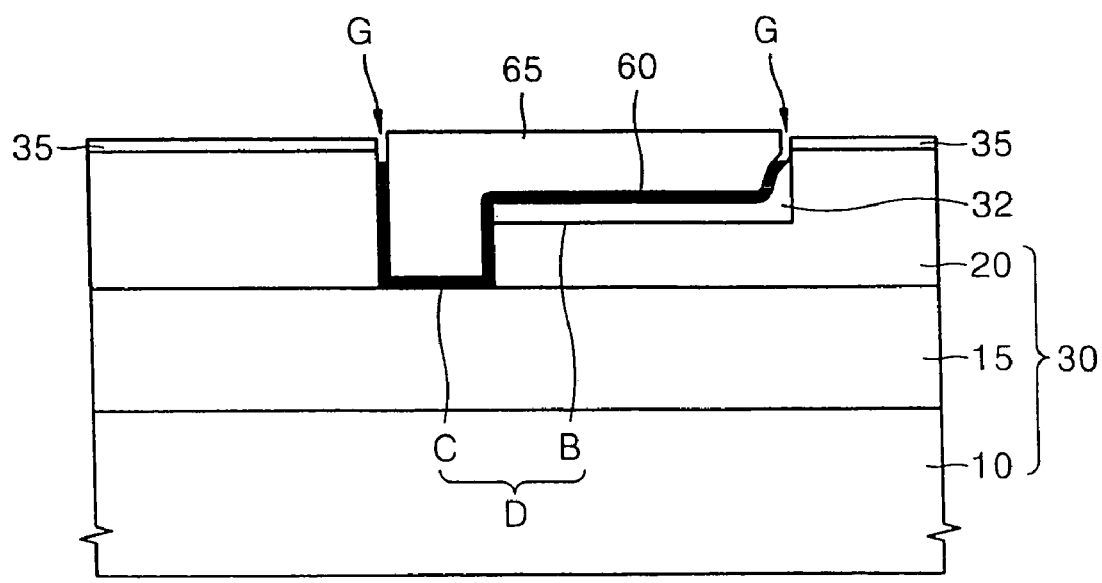
Figure 2E:
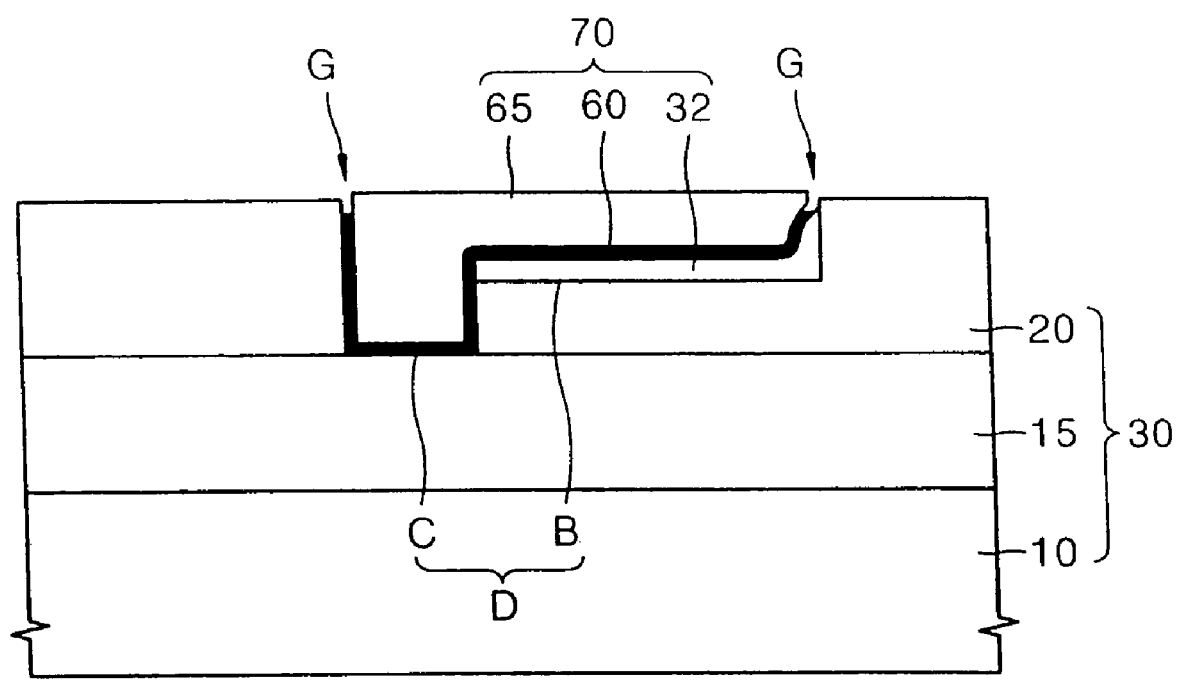

The present invention will now be described more fully with reference to the accompanying drawings, in which a preferred embodiment of the invention is shown. This invention may, however, be embodied in many different forms and should not be construed as being limited to the embodiment set forth herein. Rather, this embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 3:
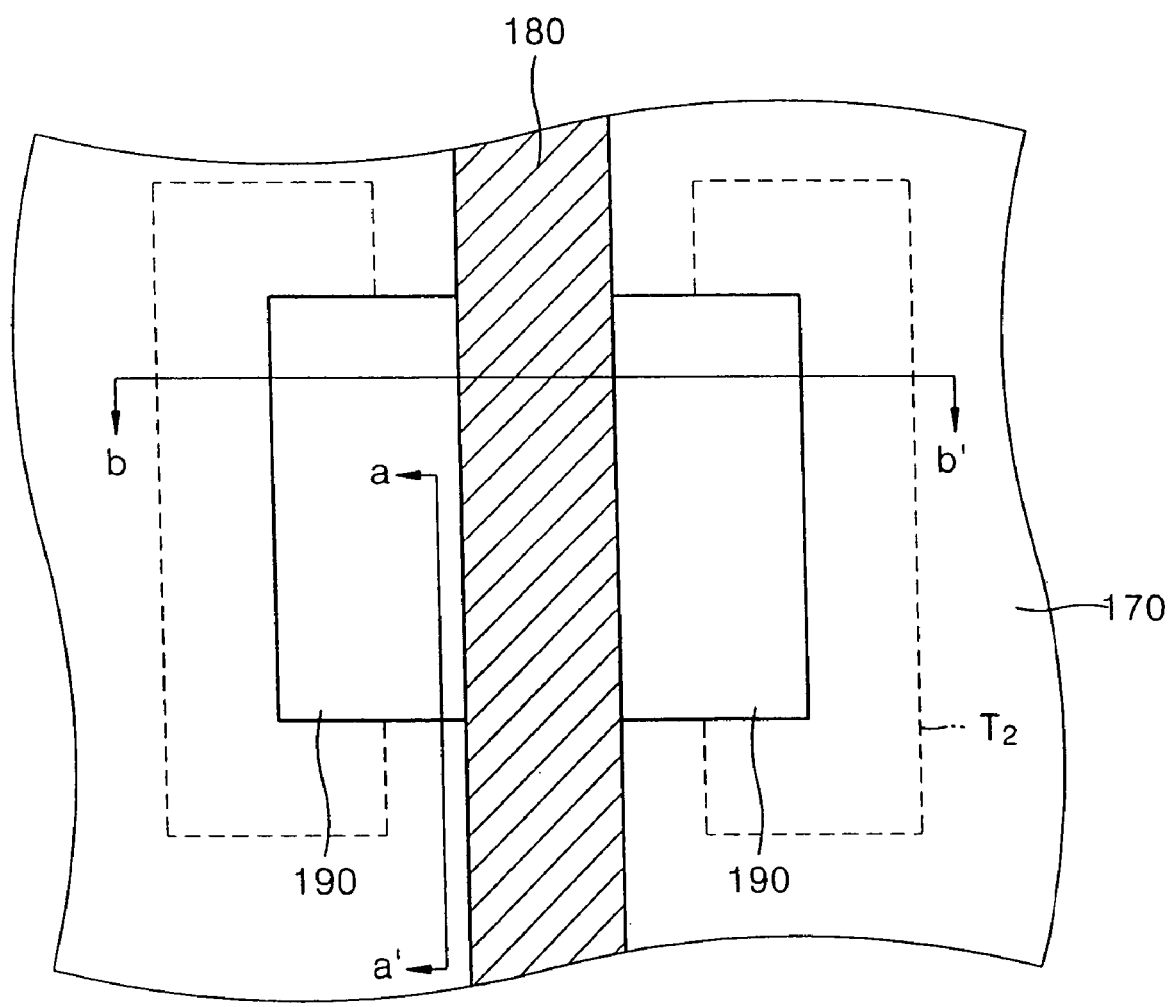
FIG. 3 is a schematic layout illustrating a semiconductor device according to an embodiment of the present invention.

FIGS. 3 and 4A through 13B are views illustrating a semiconductor device and a method for manufacturing the same according to an embodiment of the present invention. Specifically, FIG. 3 is a schematic layout illustrating a semiconductor device according to an embodiment of the present invention. FIGS. 4A, 5A, 6A, 7A, 8A, 9A, 10A, 11A, 12A, and 13A are cross-sectional views illustrating a method for manufacturing a semiconductor device according to the embodiment of the present invention, taken along line a–a' of FIG. 3. FIGS. 4B, 5B, 6B, 7B, 8B, 9B, 10B, 11B, 12B, and 13B are cross-sectional views illustrating a method for manufacturing a semiconductor device according to the embodiment of the present invention, taken along line b–b' of FIG. 3.

Figure 13A:
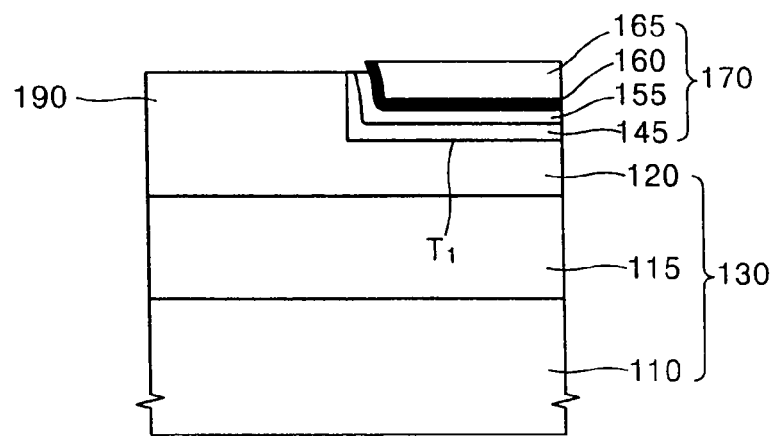
Figure 13B:
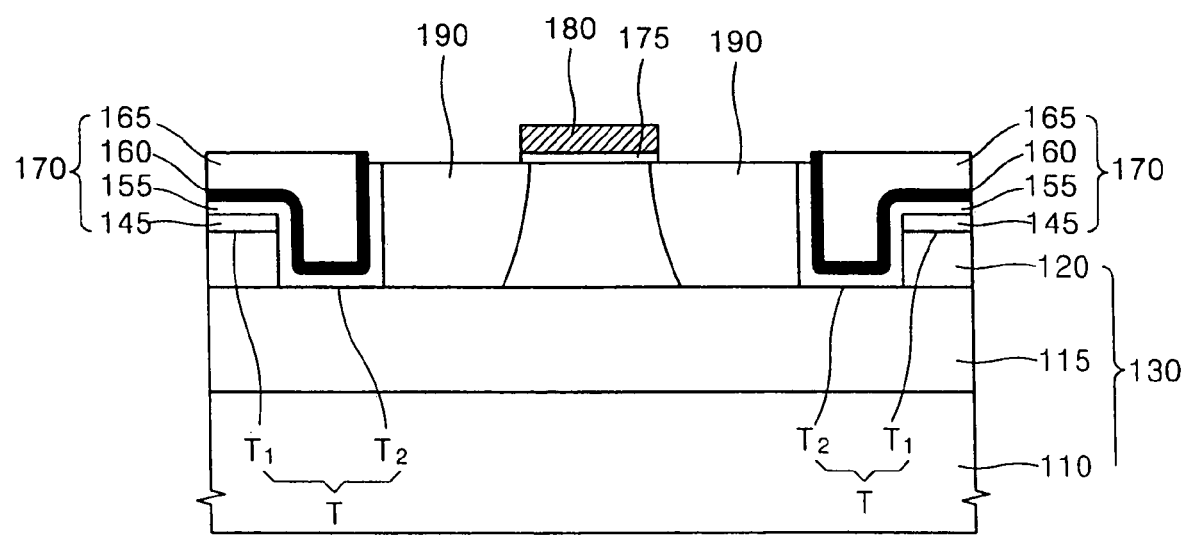

Referring to FIG. 3, an isolation layer 170 is formed to define an active region by forming a dual trench which is comprised of first and second trenches $T_1$ and $T_2$ of different depths (see FIGS. 13A and 13B). A gate 180 is formed to cross the active region, and a source/drain region 190 is formed at either side of the gate 180. The second trench $T_2$ has a greater depth than the first trench $T_1$, and the second trench $T_2$ is formed along the edge of the source/drain region 190. The present invention is not limited to the embodiment shown in FIG. 3 and may be embodied in different forms.

Hereinafter, a semiconductor device and a method for manufacturing the same according to an embodiment of the present invention will be described.

Figure 4A:
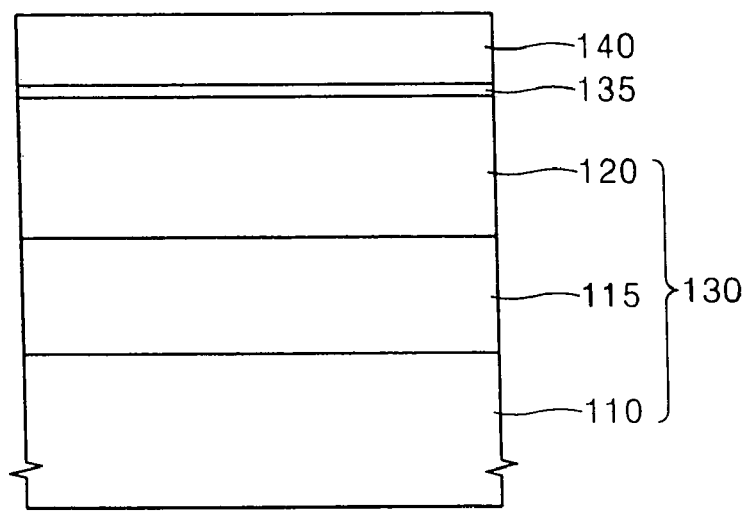
FIGS. 4A, 5A, 6A, 7A, 8A, 9A, 10A, 11A, 12A, and 13A are cross-sectional views illustrating a method for manufacturing a semiconductor device according to the embodiment of the present invention, taken along line a–a' of FIG. 3.
Figure 4B:
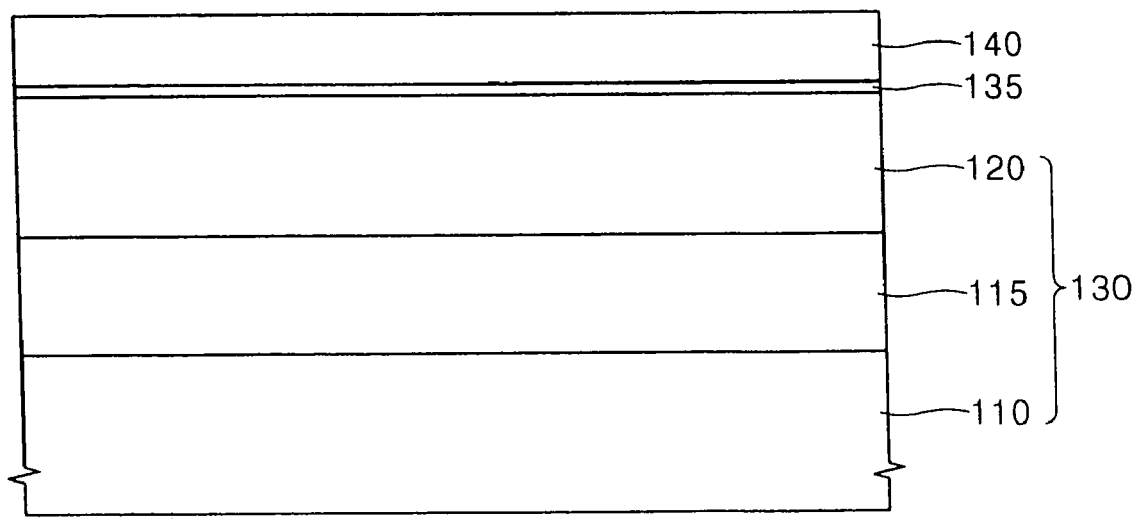
FIGS. 4B, 5B, 6B, 7B, 8B, 9B, 10B, 11B, 12B, and 13B are cross-sectional views illustrating a method for manufacturing a semiconductor device according to the embodiment of the present invention, taken along line b–b' of FIG. 3.

Referring to FIGS. 3, 4A, and 4B, a substrate 130, which includes a base layer 110, a buried oxide layer 115, and a semiconductor layer 120, is provided. The thickness of the semiconductor layer 120 may be, for example, on the order of 500–3000 Å. A pad oxide layer 135 and a nitride layer 140 are sequentially formed on the semiconductor layer 120. The pad oxide layer 135 may be formed to a thickness of 50–200 Å, and the nitride layer 140 may be formed, for example, to a thickness of 300–1600 Å. The pad oxide layer 135 acts as a buffer between the nitride layer 140 and the semiconductor layer 130, which have totally different physical properties.

Figure 5A:
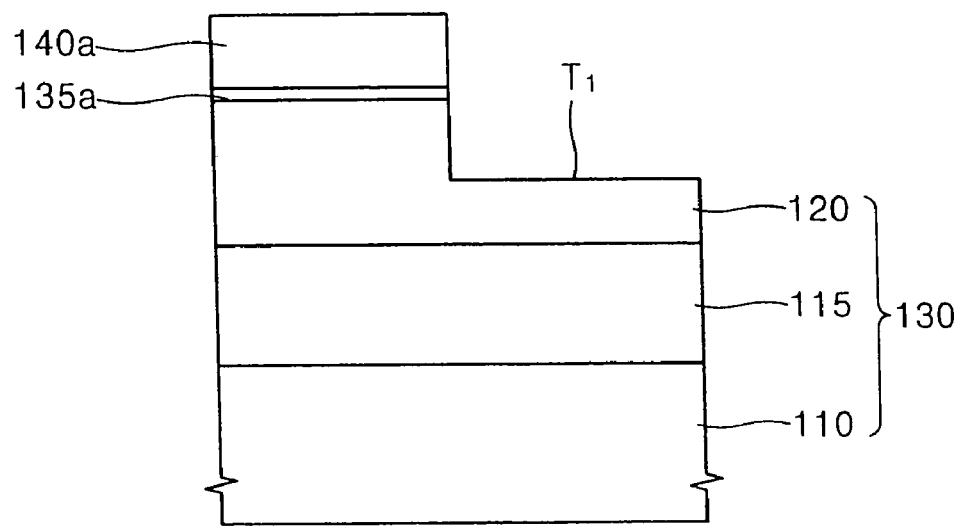
Figure 5B:
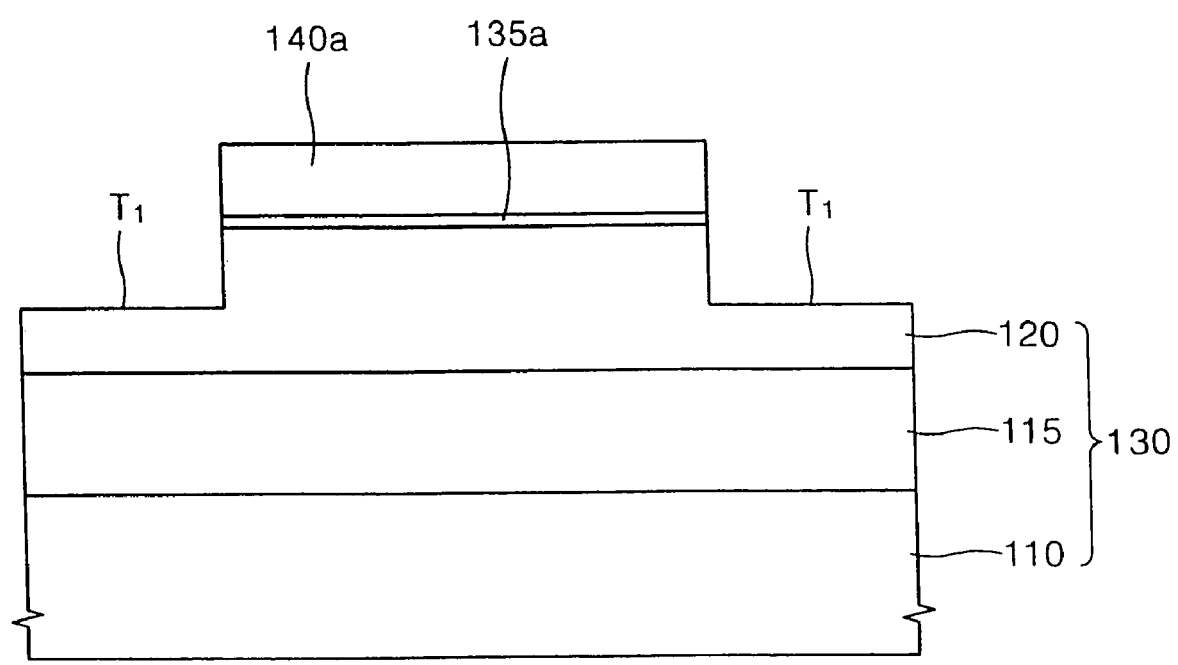

Referring to FIGS. 3, 5A, and 5B, the pad oxide layer 135 and the nitride layer 140 are patterned to expose a region on which an isolation layer for defining an active region on the semiconductor layer 120 will be formed, thereby forming a pad oxide layer pattern 135a and a nitride layer pattern 140a. Next, the semiconductor layer 120 is etched using the pad oxide layer pattern 135a and the nitride layer pattern 140a as etching masks, thereby forming a first trench $T_1$ in the semiconductor layer 120. The trench $T_1$ is formed, for example, to a height of 200–1500 Å on the buried oxide layer 115.

Figure 6A:
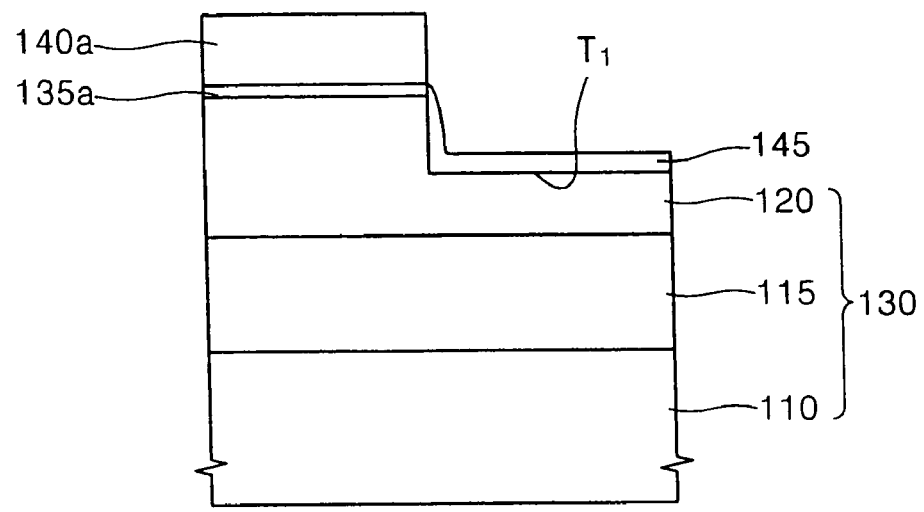
Figure 6B:
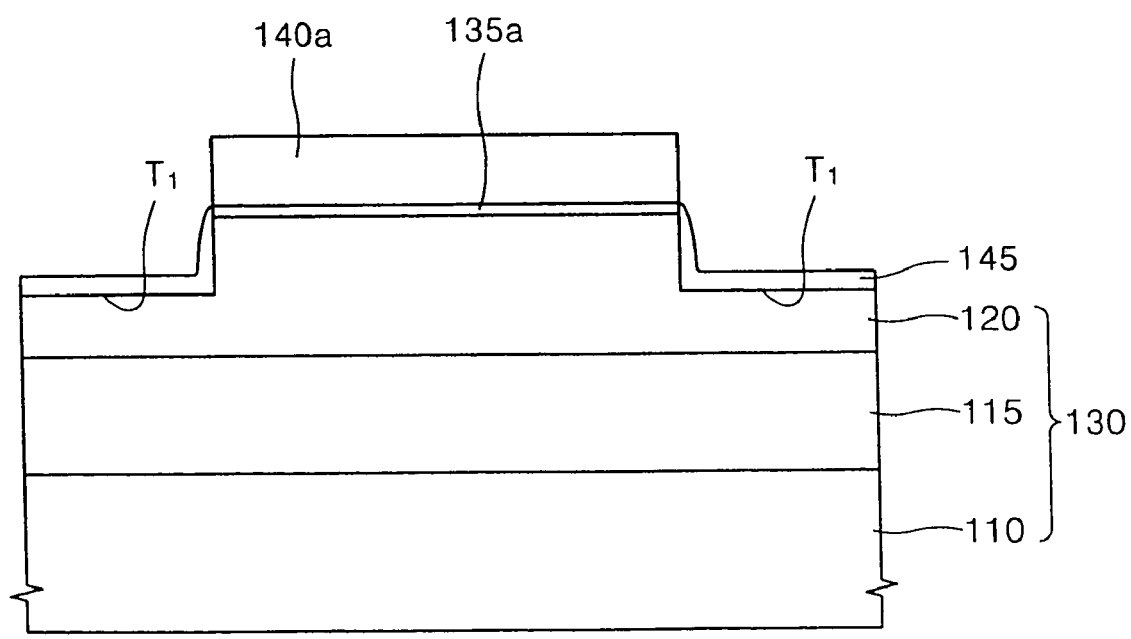

Referring to FIGS. 3, 6A, and 6B, an oxide layer 145 is formed to a thickness of 1–50 nm along the surface of the first trench $T_1$. The oxide layer 145 is preferably formed by thermal oxidation so that defects occurring on the semiconductor layer 120 in the step of forming the first trench $T_1$ can be cured. In order to form the oxide layer 145, the resulting substrate 130 is heat-treated in a gas atmosphere containing oxygen ($O_2$).

Figure 7A:
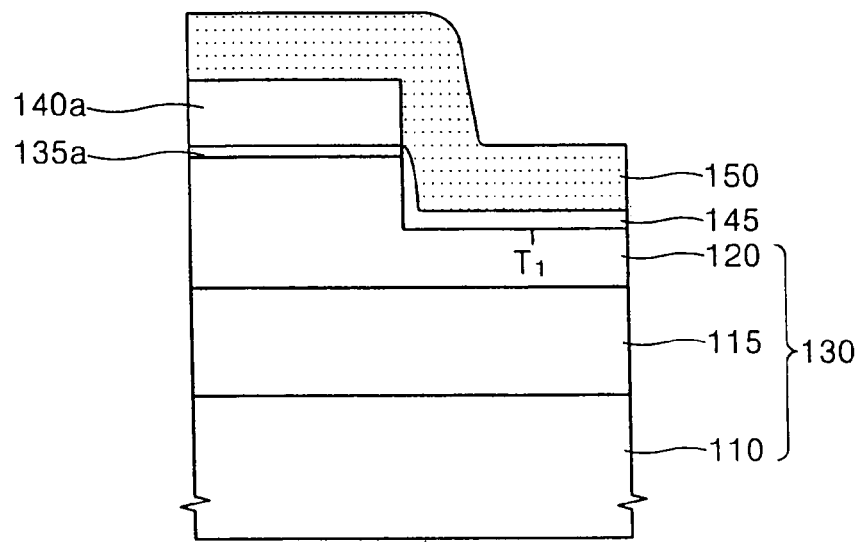
Figure 7B:
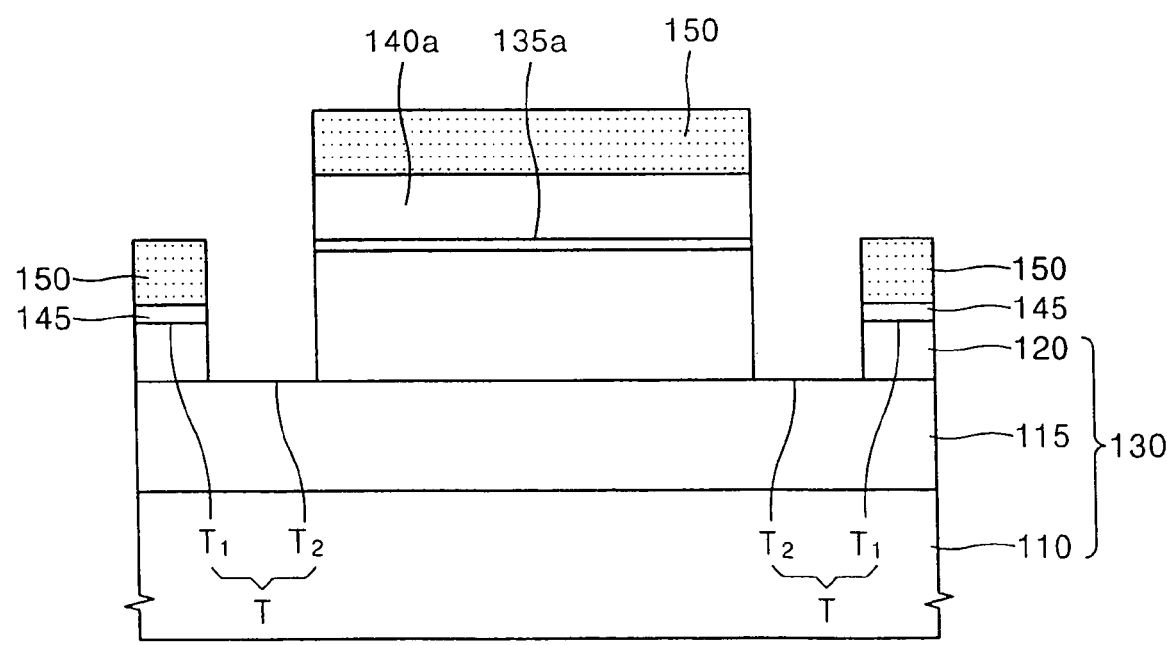

Referring to FIGS. 3, 7A, and 7B, a photoresist layer pattern 150 is formed on the substrate 130, on which the oxide layer 145 is formed, exposing a predetermined portion of the bottom of the first trench $T_1$. Next, the oxide layer 145 and the semiconductor layer 120 are etched using the photoresist layer pattern 150 as an etching mask, thereby forming a second trench $T_2$ which exposes the buried oxide layer 115. At the time of etching the oxide layer 145 and the semiconductor layer 120, the oxide layer 145 formed at a sidewall of the first trench $T_1$ is etched so that the sidewalls of the second trench $T_2$ are exposed. Then, a dual trench T comprised of the first and second trenches $T_1$ and $T_2$ and having different depths is completed. In other words, the dual trench T defines the active region on the semiconductor layer 120 and includes a first region (the first trench $T_1$ region) having a depth less than the thickness of the semiconductor layer 120 and a second region (the second trench $T_2$ region) having a depth as much as the thickness of the semiconductor layer 120.

Figure 8A:
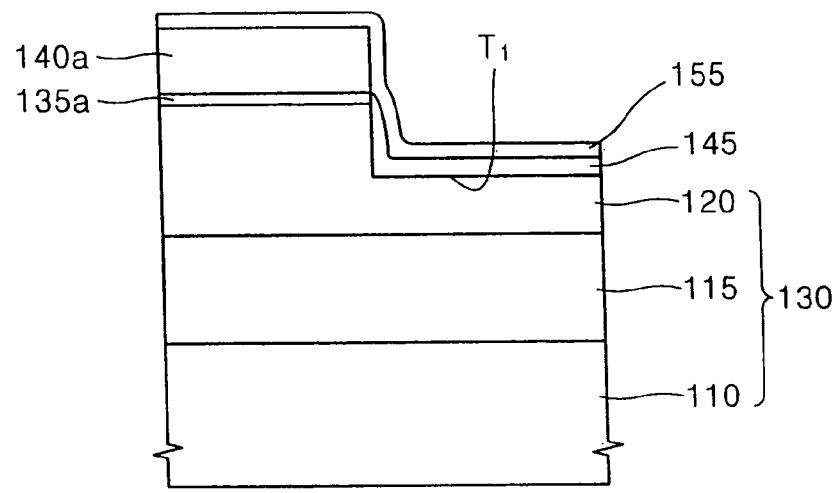
Figure 8B:
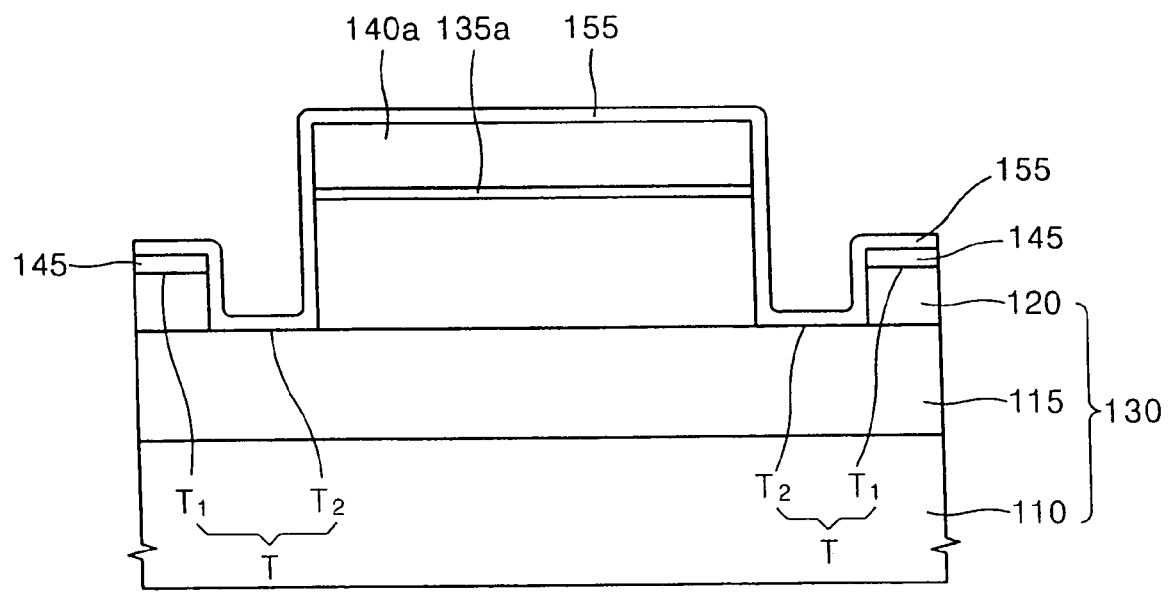

Referring to FIGS. 3, 8A, and 8B, the photoresist layer pattern 150 is removed by ashing, and then an oxide liner 155 is formed, for example, to a thickness of 3–30 nm on the substrate 130 on which the dual trench T is formed. Here, the oxide liner 155, unlike the oxide layer 145, is formed by chemical vapor deposition (CVD), preferably, low-pressure chemical vapor deposition (LP-CVD). The oxide liner 155 is preferably formed at a temperature of 650–750° C. In other words, the oxide liner 155 is preferably formed of a medium temperature oxide (MTO).

As described above, in the conventional approaches, since a trench is formed to expose a buried oxide layer and then a process for forming a thermal oxide layer is performed, a semiconductor layer may become bent due to an oxidation reaction induced by oxygen atoms infiltrating into an interfacial portion between the semiconductor layer and the buried oxide layer. However, according to the present embodiment of the present invention, the second trench $T_2$ is formed to expose the buried oxide layer 115 and then the oxide liner 155 is formed by CVD instead of thermal oxidation. Thus, the semiconductor layer 120 does not need to operate as a silicon source for forming an oxide layer and therefore, bending of the semiconductor layer can be prevented. Since bending of the semiconductor layer 120 can be prevented, an increase in leakage current to dislocation defect can also be prevented.

Figure 9A:
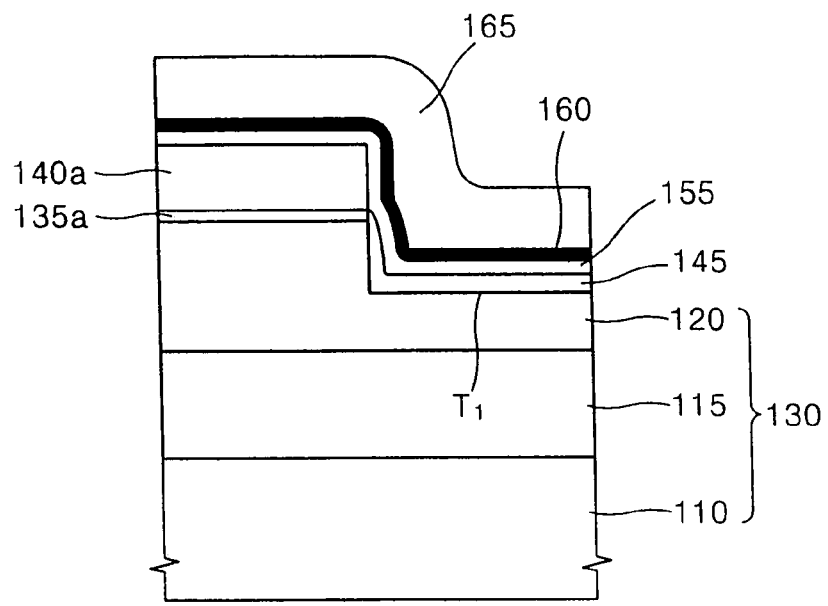
Figure 9B:
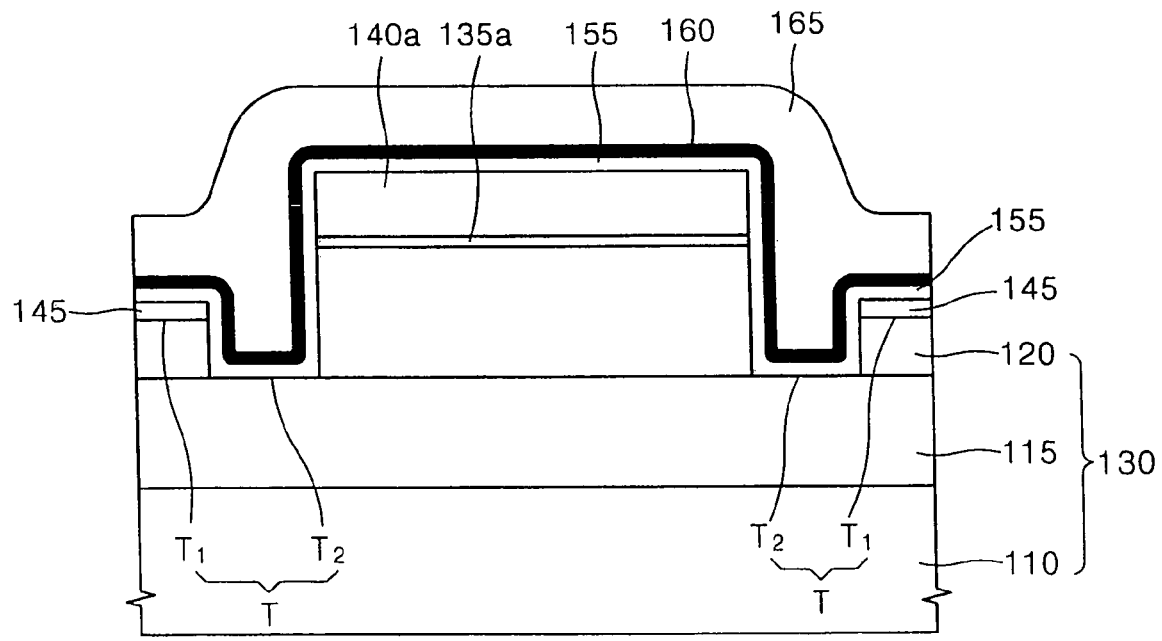

Referring to FIGS. 3, 9A, and 9B, a nitride liner 160 is formed on the substrate 130 on which the oxide liner 155 is formed. The nitride liner 160 may be formed, for example, to a thickness of 3–20 nm. The nitride liner 160 prevents the oxide layer 145 and the oxide liner 155 from being further oxidized in a subsequent process and enhances the dielectric characteristics of an isolation layer. Here, since the nitride liner 160 is formed on the oxide liner 155, the nitride liner 160 does not directly contact the semiconductor layer 120. Accordingly, mechanical stress applied to the semiconductor layer 120 by the nitride liner 160 can be prevented, and thus the probability of defects occurring on the semiconductor layer 120 can be reduced. Next, a dielectric layer 165 is formed on the substrate 130 on which the nitride liner 160 is formed to completely fill the dual trench T. The dielectric layer 165 may be formed of a undoped silicate glass (USG) layer or an oxide layer formed by high density plasma (HDP)-CVD.

Figure 10A:
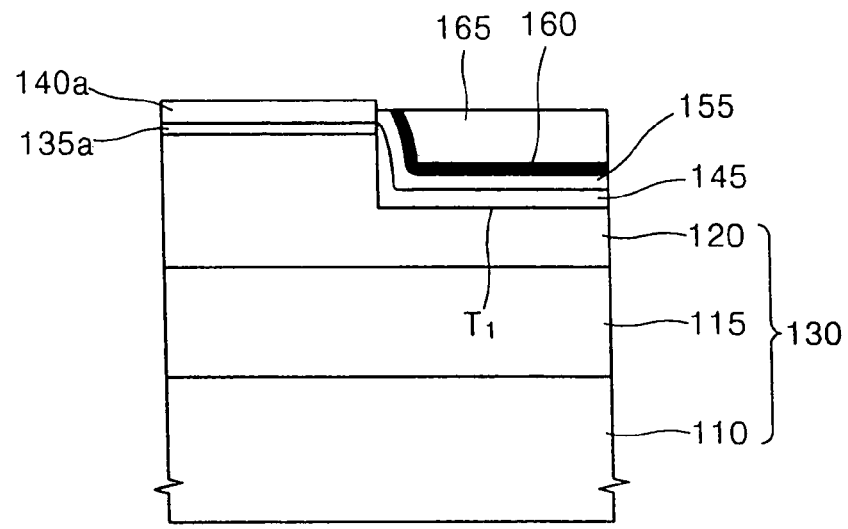
Figure 10B:
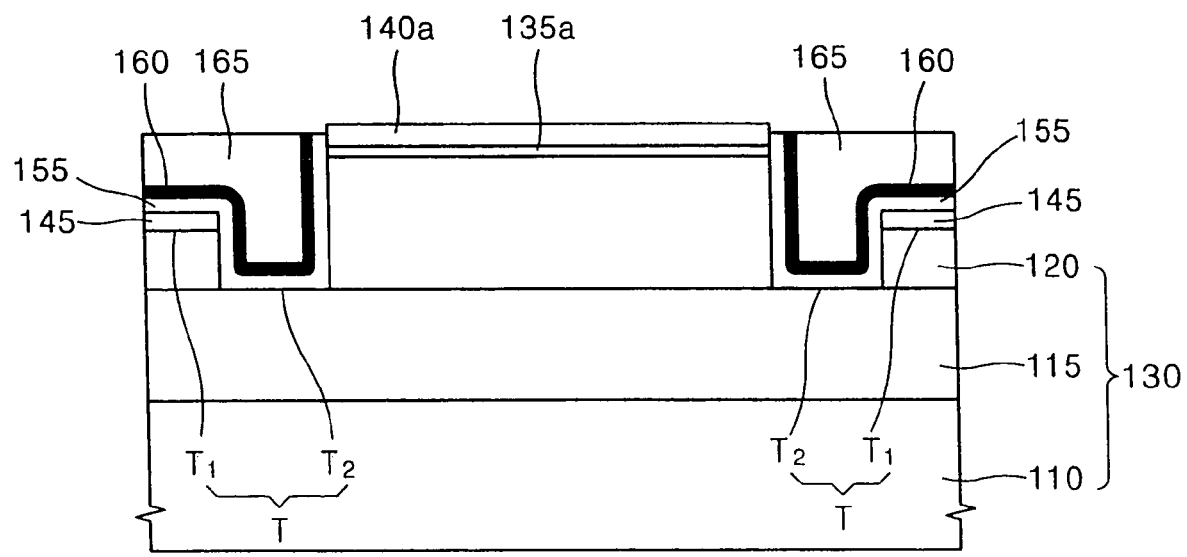

Referring to FIGS. 3, 10A, and 10B, the top surface of the substrate 130 on which the dielectric layer 165 is formed is planarized to expose the top surface of the nitride layer pattern 140a. The step of planarizing the substrate 130 on which the dielectric layer 165 is formed is performed by etch-back, preferably, chemical mechanical polishing (CMP). In the case of employing CMP, the top surface of the dielectric layer 165 may be lower than the top surface of the nitride layer pattern 140a due to the difference in the polishing rates between the dielectric layer 165 and the nitride layer pattern 140a.

Figure 11A:
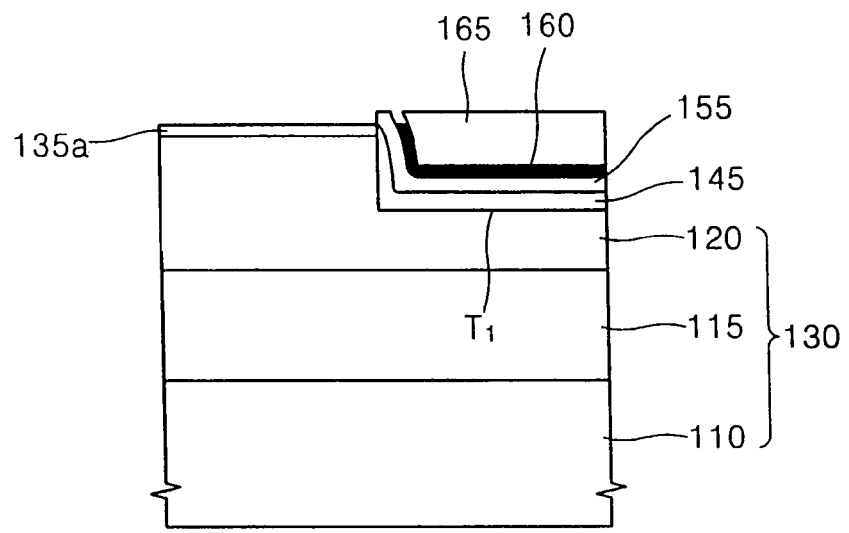
Figure 11B:
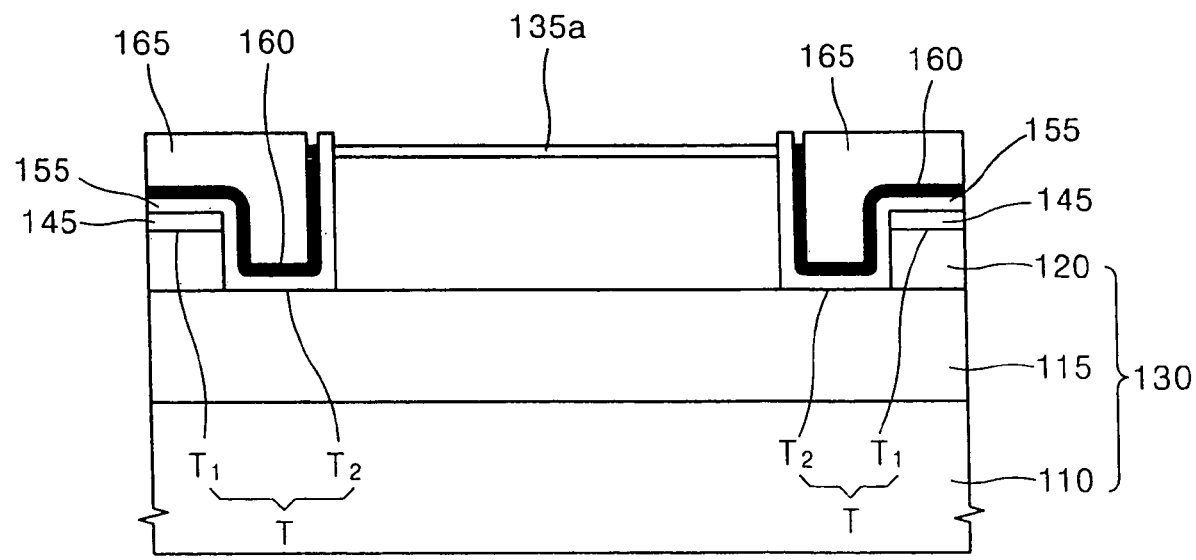

Referring to FIGS. 3, 11A, and 11B, the nitride layer pattern 140a is removed using an etching solution having an etching selectivity of a nitride layer with respect to an oxide layer. For example, the step of removing the nitride layer pattern 140a may be performed by a stripping method using phosphoric acid $H_3PO_4$. At the time of removing the nitride layer pattern 140a, the nitride liner 160 is partially removed along with the nitride layer pattern 140a. However, according to the present embodiment, the nitride liner 160 can be protected from such an etching solution by the oxide liner 155, and thus the nitride liner 160 can be prevented from being excessively etched. Therefore, a groove can be prevented from being generated at the surface of the semiconductor layer 120 between the semiconductor layer 120 and the dielectric layer 165. Since a groove is not generated, it is possible to prevent the hump phenomenon and to prevent the gate insulating layer from deteriorating. Finally, it is possible to manufacture a SOI device having a high reliability.

Figure 12A:
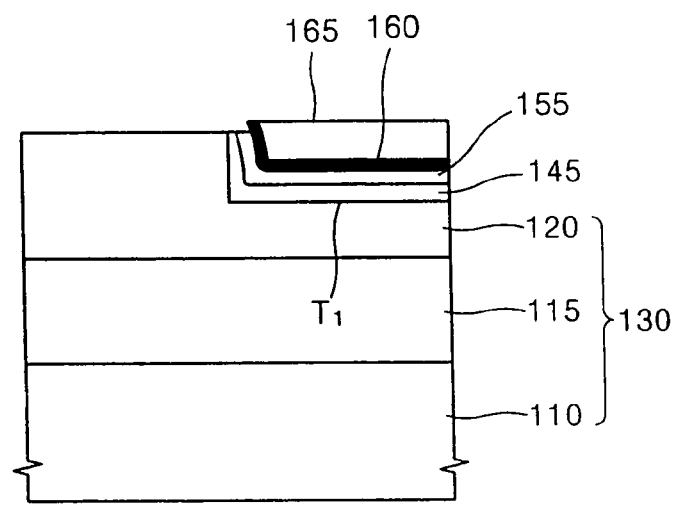
Figure 12B:
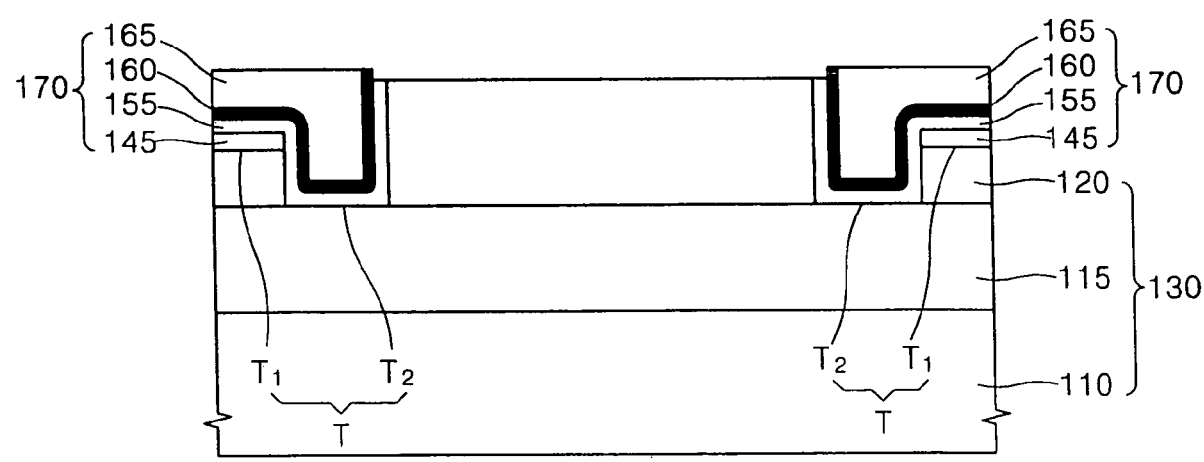

Referring to FIGS. 3, 12A, and 12B, the pad oxide layer pattern 135a is removed using an etching solution having an etching selectivity of an oxide layer with respect to a nitride layer. For example, fluoric acid (HF) may be used as the etching solution. At the time of removing the pad oxide layer pattern 135a, the top surface of the dielectric layer 165 is partially removed along with the pad oxide layer pattern 135a, thereby forming an isolation layer 170 including the oxide layer 145, the oxide liner 155, the nitride liner 160, and the dielectric layer 165 in the dual trench T.

The bottom of the isolation layer 170 has a step difference. In other words, the isolation layer 170 includes a first region, which corresponds to the first trench $T_1$ region and is referred to as a shallow isolation layer, and a second region, which corresponds to the second trench $T_2$ region and is referred to as a deep isolation layer. The second region of the isolation layer 170 contacts the buried oxide layer 115. Accordingly, the junction capacitance of a SOI device can be reduced. On the other hand, the first region of the isolation layer 170 does not contact the buried oxide layer 115. Accordingly, if a body contact is formed under the first region and then a predetermined voltage is applied to the body contact, a floating body effect can be prevented, and thus the operational characteristics of the SOI device can be stabilized.

The second trench region $T_2$ of the isolation layer 170 includes the oxide liner 155, the nitride liner 160, and the dielectric layer 165. On the other hand, the first trench region $T_1$ of the isolation layer 170 includes the oxide layer 145, the oxide liner 155, the nitride liner 160, and the dielectric layer 165. Even though the oxide layer 145 and the oxide liner 155 are formed using different methods including thermal oxidation and CVD, they are essentially the same type of oxide layer. According to the present embodiment, an oxide layer formed in the dual trench T is thicker in the first trench region $T_1$ than in the second trench region $T_2$.

Referring to FIGS. 3, 13A, and 13B, a transistor is formed in the active region. In other words, a gate insulating layer 175 is formed on the active region, thereby forming a gate electrode 180. Impurities are implanted into the semiconductor layer 120 using the gate electrode 180 as an ion implantation mask, thereby forming a source/drain region 190 at either side of the gate electrode 180. The source/drain region 190 is formed such that the bottom of the source/drain region 190 contacts the buried oxide layer 115, and thus the junction capacitance of a SOI device can be reduced. The SOI device manufactured according to such a method has characteristics appropriate for high-speed operation.

While this invention has been particularly shown and described with reference to a preferred embodiment thereof, it will be understood by those skilled in the art that various changes in form and details may be made therein without departing from the spirit and scope of the invention as defined by the appended claims.

According to the present invention, a trench, which includes a first region having a depth less than the thickness of a semiconductor layer of a SOI substrate and a second region having a depth as much as the depth of the semiconductor layer, is formed and is filled with a dielectric material, thereby forming an isolation layer having a dual trench structure.

Since the second region, which is formed relatively deeply in the isolation layer having a dual trench structure, directly contacts a buried oxide layer under the isolation layer, it is possible to completely perform device isolation and reduce the junction capacitance of a SOI device. Accordingly, it is possible to reduce the power consumption of a SOI device and enable the SOI device to operate at high speeds.

The first region, which is formed relatively shallowly in the isolation layer having a dual trench structure, does not contact the buried oxide layer. Accordingly, if a body contact is formed at the semiconductor layer and a predetermined voltage is applied to the body contact, the floating body effect can be prevented, and thus the operational characteristics of the SOI device can be stabilized. In addition, it is possible to improve the operational speed of the SOI device and manufacture a high-speed device more easily.

Since an oxide liner is formed on the semiconductor layer and then a nitride liner is formed, the nitride liner cannot directly contact the semiconductor layer and thus can be prevented from applying mechanical stress to the semiconductor layer. Accordingly, the probability of defects occurring on the semiconductor layer due to the nitride liner can be reduced, and thus the characteristics of a SOI device can be prevented from deteriorating.

Since the oxide liner is formed by CVD, an oxidation reaction induced by oxygen atoms infiltrating into an interfacial portion between the semiconductor layer and the buried oxide layer does not occur, and thus the semiconductor layer is not bent. Since the semiconductor layer is not bent in the present invention, increase in leakage current due to the dislocation defect can be prevented.

Finally, the oxide liner prevents a groove from being generated between the semiconductor layer and the isolation layer. Accordingly, the hump phenomenon of the SOI device does not occur. Thus, it is possible to prevent the gate insulating layer from deteriorating and to manufacture a SOI device having high reliability.

What is claimed is:

1. A semiconductor device comprising:
   a substrate that includes a base layer, a buried oxide layer, and a semiconductor layer; and
   an isolation layer that is formed in a trench that defines an transistor active region of the semiconductor layer,
   wherein the trench comprises a first region having a depth less than the thickness of the semiconductor layer and a second region having a depth at least equal to the thickness of the semiconductor layer in a bottom portion of the first region, wherein the isolation layer includes an oxide layer and a nitride liner that are sequentially formed on the surfaces of both the first and second regions of the trench and a dielectric layer that fills the first and second regions of the trench, and wherein the oxide layer is thicker in the first region than in the second region.

2. The semiconductor device of claim 1, wherein the depth of the first region is less than the depth of the second region by 200 to 1500 Å.

3. The semiconductor device of claim 1, wherein the oxide layer is thicker in the first region than in the second region by 1 to 50 nm.

4. The semiconductor device of claim 1, wherein the thickness of the oxide layer in the second region is in the range 3 to 30 nm.

5. The semiconductor device of claim 1, wherein the thickness of the nitride liner is in the range of 3 to 20 nm.

6. The semiconductor device of claim 1, wherein the oxide layer in the first trench includes an oxide layer and an oxide liner, and the oxide layer in the second trench includes the oxide liner, wherein the oxide liner is formed by chemical vapor deposition (CVD).

7. A semiconductor device comprising:
   a substrate that includes a base layer, a buried oxide layer, and a semiconductor layer, a first trench being formed in the semiconductor layer having a depth less than the thickness of the semiconductor layer, and a second trench being formed in the semiconductor layer having a depth at least equal to the thickness of the semiconductor layer and that is formed in a bottom portion of the first trench;
   an oxide layer that is formed on an upper surface of the first trench;
   an isolation layer that is formed on the first and second trenches that defines an transistor active region of the semiconductor layer, wherein the isolation layer includes an oxide liner and a nitride liner that are sequentially formed on the oxide layer of the first trench and on an upper surface of the second trench, the oxide liner preventing direct contact between the nitride liner and the semiconductor layer in the first and second trenches, and wherein the oxide layer and oxide liner in the first trench is of a thickness that is greater than the oxide liner in the second trench; and
   a dielectric layer that fills the first and second trenches.

8. The semiconductor device of claim 7, wherein the oxide liner is formed by chemical vapor deposition (CVD).

* * * * *